US008773455B2

(12) United States Patent
Tripathi et al.

(10) Patent No.: US 8,773,455 B2
(45) Date of Patent: Jul. 8, 2014

(54) RGB-OUT DITHER INTERFACE

(75) Inventors: Brijesh Tripathi, San Jose, CA (US); Nitin Bhargava, San Jose, CA (US)

(73) Assignee: Apple Inc., Cupertino, CA (US)

( * ) Notice: Subject to any disclaimer, the term of this patent is extended or adjusted under 35 U.S.C. 154(b) by 580 days.

(21) Appl. No.: 13/207,805

(22) Filed: Aug. 11, 2011

(65) Prior Publication Data

US 2013/0038791 A1 Feb. 14, 2013

(51) Int. Cl.

| | |
|---|---|
| ***G09G 5/00*** | (2006.01) |
| ***G09G 5/02*** | (2006.01) |
| ***G09G 1/28*** | (2006.01) |
| ***G06F 13/14*** | (2006.01) |
| ***G06T 15/00*** | (2011.01) |
| ***G09G 5/10*** | (2006.01) |
| ***H04N 9/44*** | (2006.01) |
| ***H04N 11/00*** | (2006.01) |
| ***H03M 1/12*** | (2006.01) |
| ***H04N 9/12*** | (2006.01) |
| ***G06F 5/00*** | (2006.01) |
| ***G06F 15/00*** | (2006.01) |
| ***G09G 5/395*** | (2006.01) |
| *G06F 13/24* | (2006.01) |
| *G06F 15/76* | (2006.01) |
| *G06F 9/40* | (2006.01) |
| *G06F 9/00* | (2006.01) |
| *G09G 5/18* | (2006.01) |
| *G09G 3/20* | (2006.01) |

(52) U.S. Cl.

CPC .................. *G09G 5/395* (2013.01); *G09G 5/18* (2013.01); *G09G 3/2048* (2013.01); *G09G 2360/125* (2013.01); *G09G 2370/10* (2013.01); *G09G 2340/125* (2013.01)

USPC ........... 345/596; 345/589; 345/690; 345/204; 345/520; 345/522; 348/500; 348/552; 348/574; 348/739; 710/48; 710/59; 710/260; 712/29; 712/207; 712/220

(58) Field of Classification Search

USPC ......... 345/581, 589, 596, 619, 506, 520, 522, 345/501, 204, 690, 10, 22; 348/500, 348/552–553, 557, 563, 571, 574, 575, 725, 348/739; 358/3.13, 3.14; 375/135–136, 375/146–147; 710/33–40, 48, 58–61, 710/104–106, 260; 712/28–31, 200, 205, 712/207, 220, 225

See application file for complete search history.

(56) References Cited

U.S. PATENT DOCUMENTS 5,424,755 A 6/1995 Lucas
5,777,624 A * 7/1998 Munson ........................ 345/605

(Continued)

*Primary Examiner* — Wesner Sajous

(74) *Attorney, Agent, or Firm* — Lawrence J. Merkel; Meyertons, Hood, Kivlin, Kowert & Goetzel, P.C.

(57) ABSTRACT

A display controller may include an RGB Interface module and a display port module, which may both use a target-master interface, in which the data receiving module pops pixels from the data sourcing module, and generates the HSync, VSync, and VBI timing signals. A dither module may be instantiated between the RGB interface module and display port module to perform dithering. The dither module may use a source-master interface, in which data signals and data valid signals are issued by the data sourcing module. In order to avoid having to use a large storage capacity FIFO with the dither module, a control unit may issue interface signals to the RGB Interface module and display port module, and clock-gate the dither module, to allow the data signals and data valid signals to properly interface with the RBG interface module and display port module, and provide data flow from the RGB interface module to the dither module to the display port module.

25 Claims, 7 Drawing Sheets

(56) References Cited

U.S. PATENT DOCUMENTS

| | | | | |
|---|---|---|---|---|
| 5,854,640 | A * | 12/1998 | North et al. | 345/547 |
| 6,002,385 | A | 12/1999 | Silverbrook | |
| 6,833,837 | B2 | 12/2004 | La | |
| 6,853,468 | B2 | 2/2005 | Miller | |
| 7,307,667 | B1 * | 12/2007 | Yeh et al. | 348/555 |
| 7,962,240 | B2 | 6/2011 | Morrison | |
| 2012/0127364 | A1 * | 5/2012 | Bratt et al. | 348/453 |

* cited by examiner

RGB-OUT DITHER INTERFACE

BACKGROUND

1. Field of the Invention

This invention is related to the field of graphical information processing, more particularly, to image dithering.

2. Description of the Related Art

Part of the operation of many computer systems, including portable digital devices such as mobile phones, notebook computers and the like is the use of some type of display device, such as a liquid crystal display (LCD), to display images, video information/streams, and data. Accordingly, these systems typically incorporate functionality for generating images and data, including video information, which are subsequently output to the display device. Such devices typically include video graphics circuitry to process images and video information for subsequent display.

In digital imaging, the smallest item of information in an image is called a "picture element", more generally referred to as a "pixel". For convenience, pixels are generally arranged in a regular two-dimensional grid. By using this arrangement, many common operations can be implemented by uniformly applying the same operation to each pixel independently. Since each pixel is an elemental part of a digital image, a greater number of pixels can provide a more accurate representation of the digital image. The intensity of each pixel can vary, and in color systems each pixel has typically three or four components such as red, green, blue, and black.

Most images and video information displayed on display devices such as LCD screens are interpreted as a succession of image frames, or frames for short. While generally a frame is one of the many still images that make up a complete moving picture or video stream, a frame can also be interpreted more broadly as simply a still image displayed on a digital (discrete, or progressive scan) display. A frame typically consists of a specified number of pixels according to the resolution of the image/video frame. Information associated with a frame typically consists of color values for every pixel to be displayed on the screen. Color values are commonly stored in 1-bit monochrome, 4-bit palletized, 8-bit palletized, 16-bit high color and 24-bit true color formats. An additional alpha channel is oftentimes used to retain information about pixel transparency. The color values can represent information corresponding to any one of a number of color spaces.

Under certain circumstances, the total number of colors that a given system is able to generate or manage within the given color space—in which graphics processing takes place—may be limited. In such cases, a technique called dithering is used to create the illusion of color depth in the images that have a limited color palette. In a dithered image, colors that are not available are approximated by a diffusion of colored pixels from within the available colors. Dithering in image and video processing is also used to prevent large-scale patterns, including stepwise rendering of smooth gradations in brightness or hue in the image/video frames, by intentionally applying a form of noise to randomize quantization error.

Systems that feature a display device, such as an LCD screen or other type of display, also typically feature a Display Controller to control the timing of the signals, including video synchronization signals that are provided—from a graphics processing unit, for example—to be displayed. Some Display Controllers are divided into multiple functional stages, for example an interface to receive the pixels from the source (e.g. from the graphics processing unit), and a port control unit to provide the appropriate signals to a display port physically coupling to the display. In some cases, additional functional or logic blocks are instantiated within the Display Controller between the interface and the port control unit. It is important for all components, including the additional functional/logic blocks within the Display Controller to communicate seamlessly and efficiently with each other.

Other corresponding issues related to the prior art will become apparent to one skilled in the art after comparing such prior art with the present invention as described herein.

SUMMARY

Dithering in image and video processing typically includes intentionally applying a form of noise to randomize quantization error, for example to prevent large-scale patterns, including stepwise rendering of smooth gradations in brightness or hue in the image/video frames. Modules processing pixels of video and/or image frames may therefore be injected with dither-noise during processing of the pixels. In one set of embodiments, dithering may be performed within a Display Controller on received pixels that are to be provided to a display port by the Display Controller, to display the (dithered) pixels on a graphics display.

The Display Controller may include an RGB (Red, Green, Blue) Interface module and a Display Port module that both use a "receiver is the master", or pull interface, in which the data receiving module pops pixels from the data sourcing module, and generates the HSync, VSync, and VBI timing signals. A Dither module may be instantiated between the RGB Interface module and Display Port module to perform dithering. In some embodiments, the Dither module may use a "source is the master", or push interface, in which the data-sourcing module issues data signals and data valid signals. Traditionally, to instantiate a push interface in the middle of a pull interface, a FIFO buffer with large storage capacity has to be incorporated into the design. In order to avoid having to use a large storage capacity FIFO, a clock gating scheme may be implemented with the Dither module to allow the data signals and data valid signals to properly interface with the RBG Interface module and Display Port module, and provide data flow.

One embodiment of a Display Controller may include a Dither module, and may also include a Prefetch module that generates pixel request signals to prefetch N cycles worth of data to the Dither module, where N is the pipeline depth of the Dither module (i.e., N corresponds to the number of stages in the Dither module). The Prefetch module may also control a Clock Gating module included in the Display Controller. Accordingly, data is provided through the RGB Interface module to the Dither module until the N stages within the Dither module are filled. Once the Dither module pipeline is full, the Prefetch module gates the Dither module via the Clock Gating module until the Display Port module issues a pixel request. When the Display Port module issues a pixel request, the pixel request results in the next pixel being popped from the Dither module to the Display Port module, while a next pixel is also popped into the Dither module through the RGB Interface module. When the Display Port module is requesting the last N pixels, a Mask module ensures that the pixel request results in a next pixel being popped from Dither module, but not from the RGB Interface module. This allows an uninterrupted flow when the Display Port module starts requesting pixels, without requiring a large FIFO to store all the dithered pixels.

BRIEF DESCRIPTION OF THE DRAWINGS

The following detailed description makes reference to the accompanying drawings, which are now briefly described.

Figure 1:
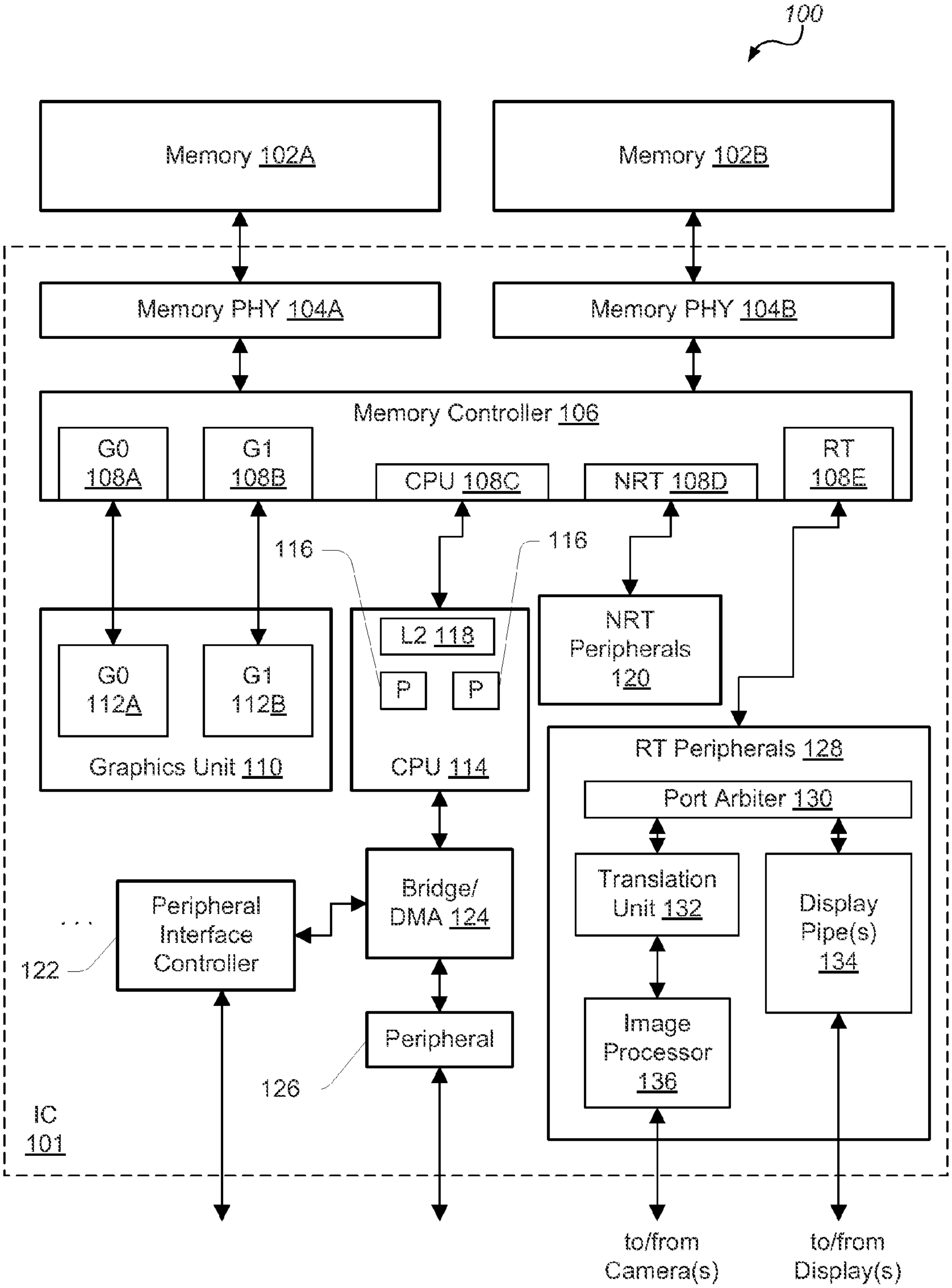
FIG. 1 is a block diagram of one embodiment of an integrated circuit that includes a graphics display system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of a system 100 is shown. In the embodiment of FIG. 1, system 100 includes an integrated circuit (IC) 101 coupled to external memories 102A-102B. In the illustrated embodiment, IC 101 includes a central processor unit (CPU) block 114, which includes one or more processors 116 and a level 2 (L2) cache 118. Other embodiments may not include L2 cache 118 and/or may include additional levels of cache. Additionally, embodiments that include more than two processors 116 and that include only one processor 116 are contemplated. IC 101 further includes a set of one or more non-real time (NRT) peripherals 120 and a set of one or more real time (RT) peripherals 128. In the illustrated embodiment, RT peripherals 128 include an image processor 136, one or more display pipes 134, a translation unit 132, and a port arbiter 130. Other embodiments may include more processors 136 or fewer image processors 136, more display pipes 134 or fewer display pipes 134, and/or any additional real time peripherals as desired. Image processor 136 may be coupled to receive image data from one or more cameras in system 100. Similarly, display pipes 134 may be coupled to one or more Display Controllers (not shown) which may control one or more displays in the system. Image processor 136 may be coupled to translation unit 132, which may be further coupled to port arbiter 130, which may be coupled to display pipes 134 as well. In the illustrated embodiment, CPU block 114 is coupled to a bridge/direct memory access (DMA) controller 124, which may be coupled to one or more peripheral devices 126 and/or to one or more peripheral interface controllers 122. The number of peripheral devices 126 and peripheral interface controllers 122 may vary from zero to any desired number in various embodiments. System 100 illustrated in FIG. 1 further includes a graphics unit 110 comprising one or more graphics controllers such as G0 112A and G1 112B. The number of graphics controllers per graphics unit and the number of graphics units may vary in other embodiments. As illustrated in FIG. 1, system 100 includes a memory controller 106 coupled to one or more memory physical interface circuits (PHYs) 104A-104B. The memory PHYs 104A-104B are configured to communicate with memories 102A-102B via pins of IC 101. Memory controller 106 also includes a set of ports 108A-108E. Ports 108A-108B are coupled to graphics controllers 112A-112B, respectively. CPU block 114 is coupled to port 108C. NRT peripherals 120 and RT peripherals 128 are coupled to ports 108D-108E, respectively. The number of ports included in memory controller 106 may be varied in other embodiments, as may the number of memory controllers. In other embodiments, the number of memory physical layers (PHYs) 104A-104B and corresponding memories 102A-102B may be less or more than the two instances shown in FIG. 1.

In one embodiment, each port 108A-108E may be associated with a particular type of traffic. For example, in one embodiment, the traffic types may include RT traffic, Non-RT (NRT) traffic, and graphics traffic. Other embodiments may include other traffic types in addition to, instead of, or in addition to a subset of the above traffic types. Each type of traffic may be characterized differently (e.g. in terms of requirements and behavior), and memory controller 106 may handle the traffic types differently to provide higher performance based on the characteristics. For example, RT traffic requires servicing of each memory operation within a specific amount of time. If the latency of the operation exceeds the specific amount of time, erroneous operation may occur in RT peripherals 128. For example, image data may be lost in image processor 136 or the displayed image on the displays to which display pipes 134 are coupled may visually distort. RT traffic may be characterized as isochronous, for example. On the other hand, graphics traffic may be relatively high bandwidth, but not latency-sensitive. NRT traffic, such as from processors 116, is more latency-sensitive for performance reasons but survives higher latency. That is, NRT traffic may generally be serviced at any latency without causing erroneous operation in the devices generating the NRT traffic. Similarly, the less latency-sensitive but higher bandwidth graphics traffic may be generally serviced at any latency. Other NRT traffic may include audio traffic, which is relatively low bandwidth and generally may be serviced with reasonable latency. Most peripheral traffic may also be NRT (e.g. traffic to storage devices such as magnetic, optical, or solid state storage). By providing ports 108A-108E associated with different traffic types, memory controller 106 may be exposed to the different traffic types in parallel.

As mentioned above, RT peripherals 128 may include image processor 136 and display pipes 134. Display pipes 134 may include circuitry to fetch one or more image frames and to blend the frames to create a display image. Display pipes 134 may further include one or more video pipelines, and video frames may be blended with (relatively) static image frames to create frames for display at the video frame rate. The output of display pipes 134 may be a stream of pixels to be displayed on a display screen. The pixel values may be transmitted to a Display Controller for display on the display screen. Image processor 136 may receive camera data and process the data to an image to be stored in memory.

Both the display pipes 134 and image processor 136 may operate in virtual address space, and thus may use translations to generate physical addresses for the memory operations to read or write memory. Image processor 136 may have a somewhat random-access memory pattern, and may thus rely on translation unit 132 for translation. Translation unit 132 may employ a translation look-aside buffer (TLB) that caches each translation for a period of time based on how frequently the translation is used with respect to other cached translations. For example, the TLB may employ a set associative or fully associative construction, and a least recently used (LRU)-type algorithm may be used to rank recency of use of the translations among the translations in a set (or across the TLB in fully associative configurations). LRU-type algorithms may include, for example, true LRU, pseudo-LRU, most recently used (MRU), etc. Additionally, a fairly large TLB may be implemented to reduce the effects of capacity misses in the TLB.

The access patterns of display pipes 134, on the other hand, may be fairly regular. For example, image data for each source image may be stored in consecutive memory locations in the virtual address space. Thus, display pipes 134 may begin processing source image data from a virtual page, and subsequent virtual pages may be consecutive to the virtual page. That is, the virtual page numbers may be in numerical order, increasing or decreasing by one from page to page as the image data is fetched. Similarly, the translations may be consecutive to one another in a given page table in memory (e.g. consecutive entries in the page table may translate virtual page numbers that are numerically one greater than or less than each other). While more than one page table may be used in some embodiments, and thus the last entry of the page table may not be consecutive to the first entry of the next page table, most translations may be consecutive in the page tables. Viewed in another way, the virtual pages storing the image data may be adjacent to each other in the virtual address space. That is, there may be no intervening pages between the adjacent virtual pages in the virtual address space.

Display pipes 134 may implement translation units that prefetch translations in advance of the display pipes' reads of image data. The prefetch may be initiated when the processing of a source image is to start, and the translation unit may prefetch enough consecutive translations to fill a translation memory in the translation unit. The fetch circuitry in the display pipes may inform the translation unit as the processing of data in virtual pages is completed, and the translation unit may invalidate the corresponding translation, and prefetch additional translations. Accordingly, once the initial prefetching is complete, the translation for each virtual page may frequently be available in the translation unit as display pipes 134 begin fetching from that virtual page. Additionally, competition for translation unit 132 from display pipes 134 may be eliminated in favor of the prefetching translation units. Since translation units 132 in display pipes 134 fetch translations for a set of contiguous virtual pages, they may be referred to as "streaming translation units."

In general, display pipes 134 may include one or more user interface units that are configured to fetch relatively static frames. That is, the source image in a static frame is not part of a video sequence. While the static frame may be changed, it is not changing according to a video frame rate corresponding to a video sequence. Display pipes 134 may further include one or more video pipelines configured to fetch video frames. These various pipelines (e.g. the user interface units and video pipelines) may be generally referred to as "image processing pipelines."

Returning to the memory controller 106, generally a port may be a communication point on memory controller 106 to communicate with one or more sources. In some cases, the port may be dedicated to a source (e.g. ports 108A-108B may be dedicated to the graphics controllers 112A-112B, respectively). In other cases, the port may be shared among multiple sources (e.g. processors 116 may share CPU port 108C, NRT peripherals 120 may share NRT port 108D, and RT peripherals 128 such as display pipes 134 and image processor 136 may share RT port 108E. A port may be coupled to a single interface to communicate with the one or more sources. Thus, when sources share an interface, there may be an arbiter on the sources' side of the interface to select between the sources. For example, L2 cache 118 may serve as an arbiter for CPU port 108C to memory controller 106. Port arbiter 130 may serve as an arbiter for RT port 108E, and a similar port arbiter (not shown) may be an arbiter for NRT port 108D. The single source on a port or the combination of sources on a port may be referred to as an agent. Each port 108A-108E is coupled to an interface to communicate with its respective agent. The interface may be any type of communication medium (e.g. a bus, a point-to-point interconnect, etc.) and may implement any protocol. In some embodiments, ports 108A-108E may all implement the same interface and protocol. In other embodiments, different ports may implement different interfaces and/or protocols. In still other embodiments, memory controller 106 may be single ported.

In an embodiment, each source may assign a quality of service (QoS) parameter to each memory operation transmitted by that source. The QoS parameter may identify a requested level of service for the memory operation. Memory operations with QoS parameter values requesting higher levels of service may be given preference over memory operations requesting lower levels of service. Each memory operation may include a flow ID (FID). The FID may identify a memory operation as being part of a flow of memory operations. A flow of memory operations may generally be related, whereas memory operations from different flows, even if from the same source, may not be related. A portion of the FID (e.g. a source field) may identify the source, and the remainder of the FID may identify the flow (e.g. a flow field). Thus, an FID may be similar to a transaction ID, and some sources may simply transmit a transaction ID as an FID. In such a case, the source field of the transaction ID may be the source field of the FID and the sequence number (that identifies the transaction among transactions from the same source) of the transaction ID may be the flow field of the FID. In some embodiments, different traffic types may have different definitions of QoS parameters. That is, the different traffic types may have different sets of QoS parameters.

Memory controller 106 may be configured to process the QoS parameters received on each port 108A-108E and may use the relative QoS parameter values to schedule memory operations received on the ports with respect to other memory operations from that port and with respect to other memory operations received on other ports. More specifically, memory controller 106 may be configured to compare QoS parameters that are drawn from different sets of QoS parameters (e.g. RT QoS parameters and NRT QoS parameters) and may be configured to make scheduling decisions based on the QoS parameters.

In some embodiments, memory controller 106 may be configured to upgrade QoS levels for pending memory operations. Various upgrade mechanism may be supported. For example, the memory controller 106 may be configured to upgrade the QoS level for pending memory operations of a flow responsive to receiving another memory operation from the same flow that has a QoS parameter specifying a higher QoS level. This form of QoS upgrade may be referred to as in-band upgrade, since the QoS parameters transmitted using the normal memory operation transmission method also serve as an implicit upgrade request for memory operations in the same flow. The memory controller 106 may be configured to push pending memory operations from the same port or source, but not the same flow, as a newly received memory operation specifying a higher QoS level. As another example, memory controller 106 may be configured to couple to a sideband interface from one or more agents, and may upgrade QoS levels responsive to receiving an upgrade request on the sideband interface. In another example, memory controller 106 may be configured to track the relative age of the pending memory operations. Memory controller 106 may be configured to upgrade the QoS level of aged memory operations at certain ages. The ages at which upgrade occurs may depend on the current QoS parameter of the aged memory operation.

Memory controller 106 may be configured to determine the memory channel addressed by each memory operation received on the ports, and may be configured to transmit the memory operations to memory 102A-102B on the corresponding channel. The number of channels and the mapping of addresses to channels may vary in various embodiments and may be programmable in the memory controller. Memory controller 106 may use the QoS parameters of the memory operations mapped to the same channel to determine an order of memory operations transmitted into the channel.

Processors 116 may implement any instruction set architecture, and may be configured to execute instructions defined in that instruction set architecture. For example, processors 116 may employ any microarchitecture, including but not limited to scalar, superscalar, pipelined, superpipelined, out of order, in order, speculative, non-speculative, etc., or combinations thereof. Processors 116 may include circuitry, and optionally may implement microcoding techniques, and may include one or more level 1 caches, making cache 118 an L2 cache. Other embodiments may include multiple levels of caches in processors 116, and cache 118 may be the next level down in the hierarchy. Cache 118 may employ any size and any configuration (set associative, direct mapped, etc.).

Graphics controllers 112A-112B may be any graphics processing circuitry. Generally, graphics controllers 112A-112B may be configured to render objects to be displayed, into a frame buffer. Graphics controllers 112A-112B may include graphics processors that may execute graphics software to perform a part or all of the graphics operation, and/or hardware acceleration of certain graphics operations. The amount of hardware acceleration and software implementation may vary from embodiment to embodiment.

NRT peripherals 120 may include any non-real time peripherals that, for performance and/or bandwidth reasons, are provided independent access to memory 102A-102B. That is, access by NRT peripherals 120 is independent of CPU block 114, and may proceed in parallel with memory operations of CPU block 114. Other peripherals such as peripheral 126 and/or peripherals coupled to a peripheral interface controlled by peripheral interface controller 122 may also be non-real time peripherals, but may not require independent access to memory. Various embodiments of NRT peripherals 120 may include video encoders and decoders, scaler/rotator circuitry, image compression/decompression circuitry, etc.

Bridge/DMA controller 124 may comprise circuitry to bridge peripheral(s) 126 and peripheral interface controller(s) 122 to the memory space. In the illustrated embodiment, bridge/DMA controller 124 may bridge the memory operations from the peripherals/peripheral interface controllers through CPU block 114 to memory controller 106. CPU block 114 may also maintain coherence between the bridged memory operations and memory operations from processors 116/L2 Cache 118. L2 cache 118 may also arbitrate the bridged memory operations with memory operations from processors 116 to be transmitted on the CPU interface to CPU port 108C. Bridge/DMA controller 124 may also provide DMA operation on behalf of peripherals 126 and peripheral interface controllers 122 to transfer blocks of data to and from memory. More particularly, the DMA controller may be configured to perform transfers to and from memory 102A-102B through memory controller 106 on behalf of peripherals 126 and peripheral interface controllers 122. The DMA controller may be programmable by processors 116 to perform the DMA operations. For example, the DMA controller may be programmable via descriptors, which may be data structures stored in memory 102A-102B to describe DMA transfers (e.g. source and destination addresses, size, etc.). Alternatively, the DMA controller may be programmable via registers in the DMA controller (not shown).

Peripherals 126 may include any desired input/output devices or other hardware devices that are included on IC 101. For example, peripherals 126 may include networking peripherals such as one or more networking media access controllers (MAC) such as an Ethernet MAC or a wireless fidelity (WiFi) controller. An audio unit including various audio processing devices may be included in peripherals 126. Peripherals 126 may include one or more digital signal processors, and any other desired functional components such as timers, an on-chip secrets memory, an encryption engine, etc., or any combination thereof.

Peripheral interface controllers 122 may include any controllers for any type of peripheral interface. For example, peripheral interface controllers 122 may include various interface controllers such as a universal serial bus (USB) controller, a peripheral component interconnect express (PCIe) controller, a flash memory interface, general purpose input/output (I/O) pins, etc.

Memories 102A-102B may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 101 in a chip-on-chip configuration, a package-on-package configuration, or a multi-chip module configuration.

Memory PHYs 104A-104B may handle the low-level physical interface to memory 102A-102B. For example, memory PHYs 104A-104B may be responsible for the timing of the signals, for proper clocking to synchronous DRAM memory, etc. In one embodiment, memory PHYs 104A-104B may be configured to lock to a clock supplied within IC 101 and may be configured to generate a clock used by memory 102A and/or memory 102B.

It is noted that other embodiments may include other combinations of components, including subsets or supersets of the components shown in FIG. 1 and/or other components. While one instance of a given component may be shown in FIG. 1, other embodiments may include one or more instances of the given component. Similarly, throughout this detailed description, one or more instances of a given component may be included even if only one is shown, and/or embodiments that include only one instance may be used even if multiple instances are shown.

Figure 2:
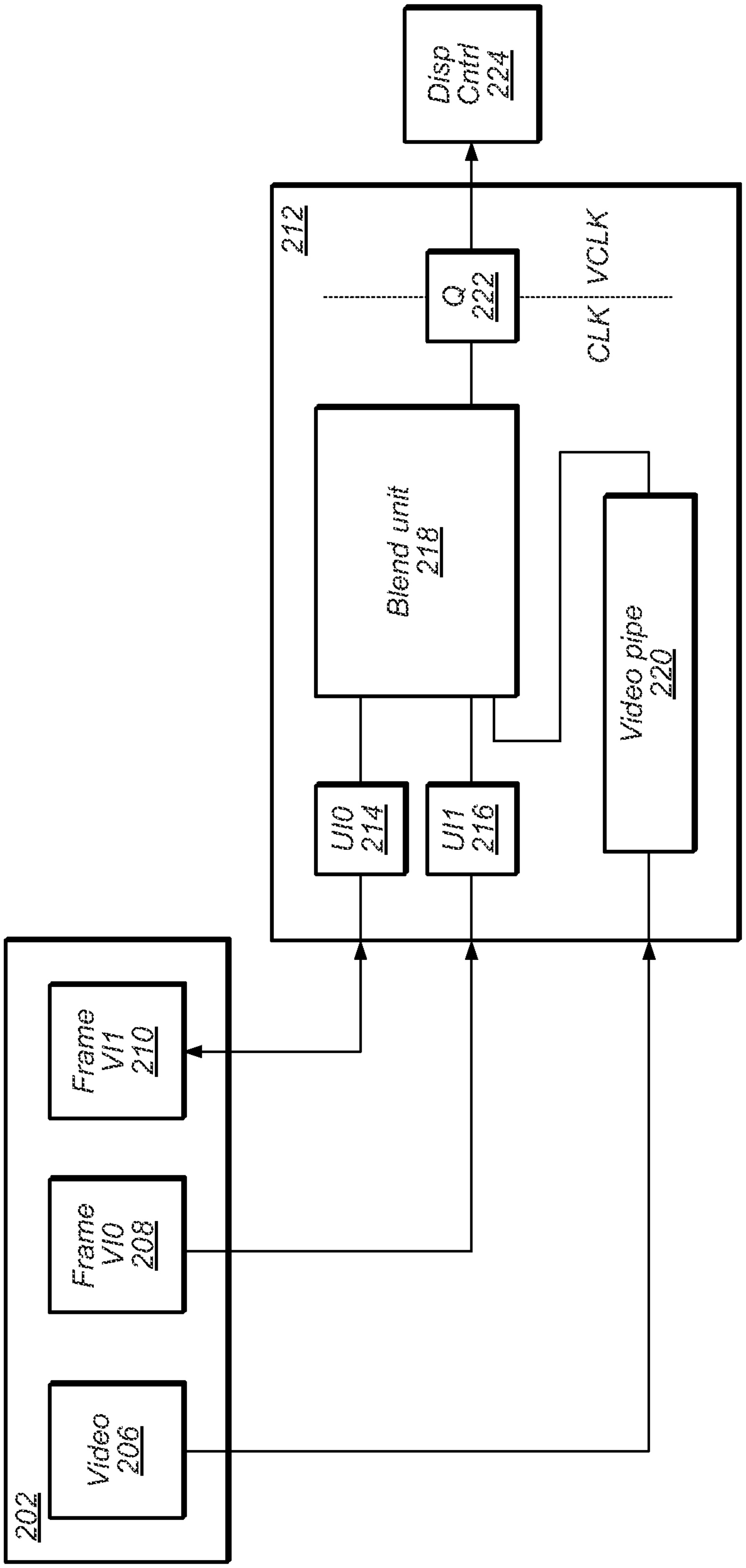
FIG. 2 is a block diagram of one embodiment of a graphics display system that includes a display controller.

Turning now to FIG. 2, a partial block diagram is shown providing an overview of an exemplary system in which image frame information may be stored in memory 202, which may be system memory, and provided to a display pipe 212. As shown in FIG. 2, memory 202 may include a video buffer 206 for storing video frames/information, and one or more (in the embodiment shown, a total of two) image frame buffers 208 and 210 for storing image frame information. In some embodiments, the video frames/information stored in video buffer 206 may be represented in a first color space, according the origin of the video information. For example, the video information may be represented in the YCbCr color space. At the same time, the image frame information stored in image frame buffers 208 and 210 may be represented in a second color space, according to the preferred operating mode of display pipe 212. For example, the image frame information stored in image frame buffers 208 and 210 may be represented in the RGB color space. Display pipe 212 may include one or more user interface (UI) units, shown as UI 214 and 216 in the embodiment of FIG. 2, which may be coupled to memory 202 from where they may fetch the image frame data/information. A video pipe or processor 220 may be similarly configured to fetch the video data from memory 202, more specifically from video buffer 206, and perform various operations on the video data. One of these operations may include performing dither-noise injection on the fetched video frame(s), or, on the fetched pixels corresponding to a video frame(s), to prevent large-scale patterns, including preventing stepwise rendering of smooth gradations in brightness or hue in the video frame(s). To put it another way, display pipe unit 220 may inject the fetched video pixels of the video frames with dither-noise during processing of the pixels. UI 214 and 216, and video pipe 220 may respectively provide the fetched and processed image frame information and processed video image information to a blend unit 218 to generate output frames that may be stored in a buffer 222, from which they may be provided to a Display Controller 224 for display on a display device (not shown), for example an LCD.

Overall, the operation of display pipe 212 may be characterized as fetching data from memory, processing that data, then presenting it to an external Display Controller 224 through a buffer 222, which may be an asynchronous FIFO (First-In-First-Out) buffer. The Display Controller 224 may control the timing of the display through a Vertical Blanking Interval (VBI) signal that may be activated at the beginning of each vertical blanking interval. This signal may cause display pipe 212 to initialize (Restart) and start (Go) the processing for a frame (more specifically, for the pixels within the frame). Between initializing and starting, configuration parameters unique to that frame may be modified. Any parameters not modified may retain their value from the previous frame. As the pixels are processed and put into output FIFO 222, the Display Controller may issue signals (referred to as pop signals) to remove the pixels at the Display Controller's clock frequency (indicated as VCLK in FIG. 2).

Blend unit 218 may be situated at the backend of display pipe 212 as shown in FIG. 2. It may receive frames of pixels represented in a specified color space (e.g. RGB) from UI 214 and UI 216, and pixels also represented in a specified color space, which may be the same or different than the specified color space associated with the pixels received from UI 214 and UI 216 (e.g. it may be the YCbCr color space) from video pipe 220. Blend unit 218 may blend the pixels together layer by layer, once the pixels obtained from video pipe 220 have been converted, if necessary, to the same color space as the one associated with the pixels received from UI 214 and UI 216. The final resultant pixels (which may be RGB of 10-bits each, for example) may be converted to a desired color space, if necessary, for displaying the blended pixels (e.g. it may be converted back to a YCbCr color space). The pixels thus obtained may be queued up in output FIFO 222 at the video pipe's clock rate of CLK, and fetched by Display Controller 224 at the Display Controller's clock rate of VCLK. It should be noted that while FIFO 222 is shown outside blend unit 218, alternative embodiments may position FIFO 222 inside blend unit 218, or possibly within Display Controller unit 224. In addition, color space conversion may take place prior to providing the resultant pixels to FIFO 222, it may be performed on the data fetched from FIFO 222. In one set of embodiments, dithering may also be performed inside Display Controller 224, as will further be described below.

Figure 3:
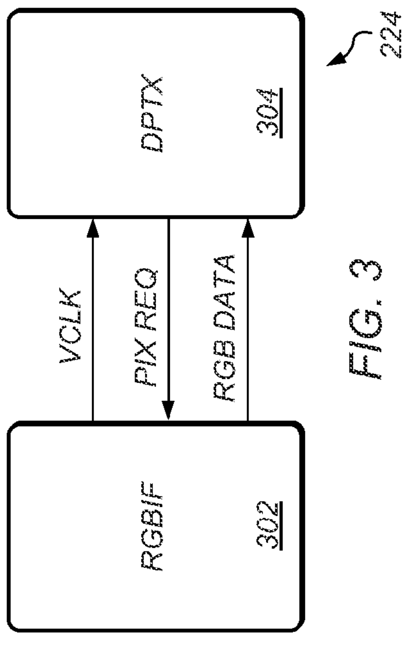
FIG. 3 is a simplified block diagram of one embodiment of a display controller that includes an interface module and a display port module.
Figure 4:
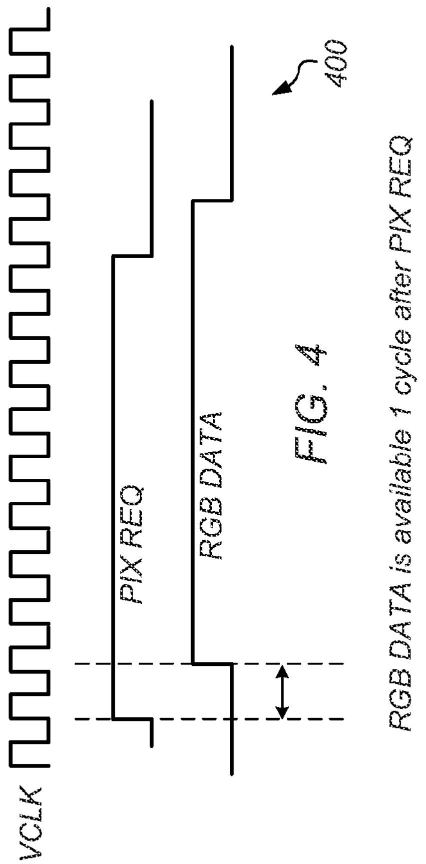
FIG. 4 is a timing diagram illustrating the timing of the signals featured in the display controller of FIG. 3.

FIG. 3 shows one possible embodiment of Display Controller 224. In the embodiment shown in FIG. 3, Display Controller 224 may include an interface module 302, which may interface with FIFO 222 to receive the pixels from FIFO 222. In the embodiment shown in FIG. 3, interface module 302 is shown to receive the pixels in RGB format, hence the interface module 302 is named RGBIF. However, in alternate embodiments, interface module 302 may be receiving the pixels in another color space format, for example in the YCbCr format, or yet another one of various available and commonly used color space formats, depending on the needs of the specific system. Interface module 302 may communicate with a display port controller, also referred to as a display port transmit module (DPTX) 304, which may provide the pixels to a display via a display port connector, for example via a DVI or HDMI port. Interface module 302 may operate using a slave interface, in which the data receiver is expected to operate as the master device. Accordingly, interface module 302, which is the receiving device, may remove the pixels from FIFO 222, which is the data source in this case, at the Display Controller's clock frequency, designated as VCLK (see also FIG. 2). Interface module 302 may remove the pixels from FIFO 222 upon receiving a pixel request signal (PIX REQ) from DPTX module 304. More specifically, as indicated in FIG. 4, RGBIF module 302 may provide the RGB data to DPTX module 304 one clock cycle (of VCLK) subsequent to DPTX module having issued a PIX REQ signal to RGBIF module 302.

Figure 5:
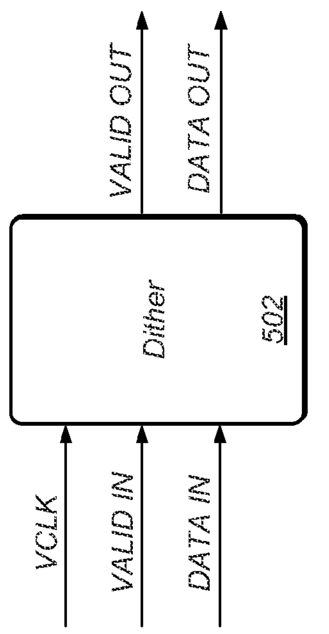
FIG. 5 is a block diagram showing the signals featured in one embodiment of a dither module.
Figure 6:
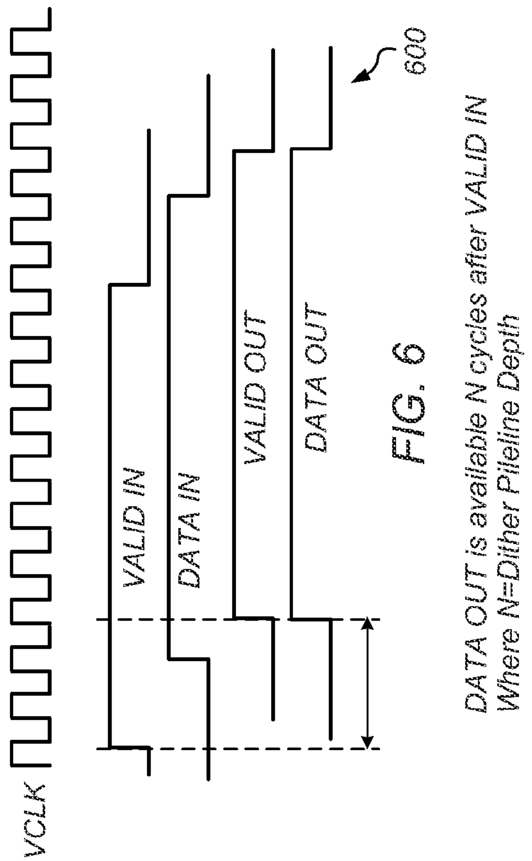
FIG. 6 is a timing diagram illustrating the timing of the signals featured in the dither module of FIG. 5.

In one set of embodiments, dithering may also be performed within Display Controller 224. One example of the signal connectivity of a Dither module that performs dithering is shown in FIG. 5. Dither module 502 may receive a display controller clock signal VCLK, a VALID IN signal, and a DATA IN signal, and output a VALID OUT signal and DATA OUT signal. As seen in the timing diagram of FIG. 6, the DATA OUT signal may become available a specified number (N) cycles subsequent to the Dither module 502 receiving the VALID IN signal, where N is the depth of the dither pipeline within Dither module 502 (i.e., the number of stages within Dither module 502). As shown in FIG. 5 and FIG. 6, Dither module 502 uses a push, or master interface, receiving data signals (DATA IN) and data valid signals (VALID IN) issued by the data sourcing module from where Dither module 502 may receive the pixel data. In one set of embodiments, Dither module 502 may be instantiated, i.e. arranged between the interface module 302 and display port control module 304 in a manner that provides appropriate data flow without requiring a large storage FIFO.

Figure 7:
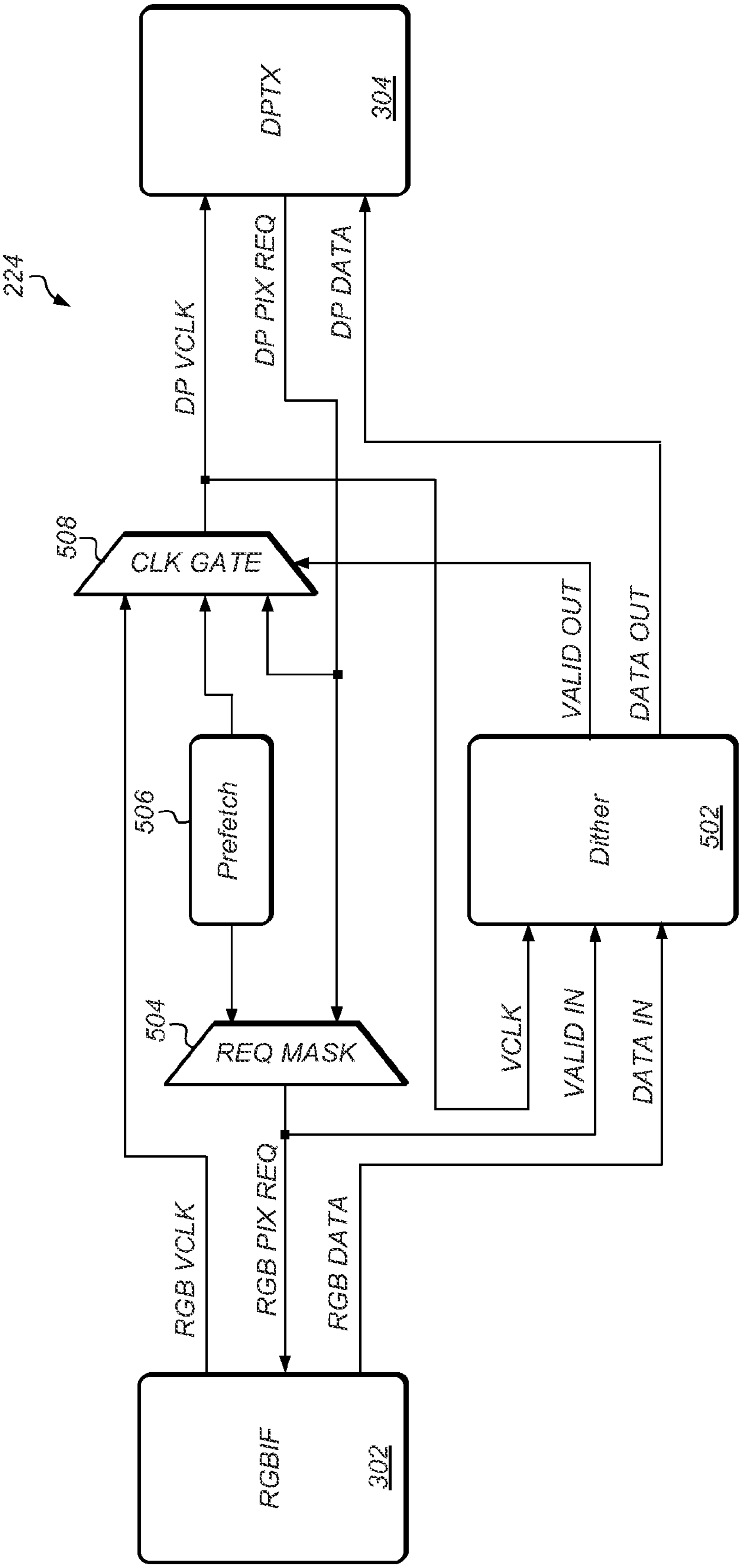
FIG. 7 is a simplified block diagram of one embodiment of a display controller that includes a dither module instantiated between an interface module and a display port module.

FIG. 7 shows the partial block diagram of one embodiment of a display controller that performs dithering on pixel streams received from a source (e.g. from a display pipe 212 shown in FIG. 2) before providing the pixels in the pixel stream to a graphics display. The Display Controller 224 may include an RGB (Red, Green, Blue) Interface module 302 and a Display Port module 304 that both use a “receiver is the master”, or pull interface, in which the data receiving module pops pixels from the data sourcing module. DPTX 304 may therefore be configured to generate the HSync, VSync, and VBI timing signals used in displaying the received pixels on a display (not shown) that may be coupled to DPTX module 304. Dither module 502 may be instantiated between RGB Interface module 302 and Display Port module 304 as shown, to perform dithering. As previously mentioned, Dither module 502 may use a “source is the master”, or push interface, in which the data-sourcing module issues data signals and data valid signals. Display controller 224 features a clock gating scheme implemented using Prefetch module 506, Request Mask 504, and Clock Gate module 508. The clock gating scheme allows the data signals and data valid signals received and issued by Dither module 502 to properly interface with RBG Interface module 302 and Display Port module 304, and provide essentially uninterrupted data flow.

In one set of embodiments, Prefetch module 506 may generate pixel request signals to prefetch N cycles worth of data to the Dither module 502. N is a non-zero integer number corresponding to the pipeline depth of the Dither module 502 (i.e., N corresponds to the number of stages in the Dither module 502). As shown in FIG. 7, the pixel request signal generated by Prefetch module 506 is conveyed as signal ‘RGB PIX REQ’ to RGBIF 302 via Mask 504. Prefetch module 506 may also control Clock Gating module 508, as will be further described below. Upon receiving the ‘RGB PIX REQ’ signal, RGBIF module 302 may operate to pop requested pixels from the pixel source, for example from display pipe 212 (as shown in FIG. 2), and provide those pixels to Dither module 502 via ‘RGB DATA’ coupling to ‘DATA IN’ of Dither module 502. During this transfer, ‘RGB PIX REQ’ provides the requisite ‘VALID IN’ signal to Dither module 502. In other words, once Prefetch module 506 has issued the pixel request signals, data may be provided through RGB Interface module 302 to the Dither module 502. RGB Interface module 302 may provide the pixels to Dither module 502 until the N stages within Dither module 502 are filled. Once the pipeline of Dither module 502 is full, Prefetch module 506 may gate Dither module 502 via Clock Gating module 508 to prevent any pixels from Dither module 502 from being popped to Display Port module 304 through the ‘DATA OUT’ output of Dither module 502, which would otherwise occur once the pipeline of Dither module 502 is full (see the description of Dither module 502 with regards to FIG. 5 above). Accordingly, Prefetch module 506 may gage Dither module 502 until Display Port module 304 issues a pixel request via ‘DP PIX REQ’.

Once the Display Port module 304 has issued a pixel request via ‘DP PIX REQ’, Prefetch module 506 stops gating Dither module 502, and the next pixel is popped from Dither module 502 to the Display Port module 304 in through ‘DP DATA’ from ‘DATA OUT’. That is, pixel data is output through ‘DATA OUT’ by Dither module 502, and is received by Display Port module 304 through ‘DP DATA’. At the same time, a next pixel is also popped into Dither module 502 through the RGB Interface module 302 via ‘RGB DATA’, with the corresponding ‘VALID IN’ signal expected by Dither module 502 provided via ‘RGB PIX REQ’. When Display Port module 304 is requesting the last N pixels, Mask module 504 ensures that the pixel request ‘DP PIX REQ’ is masked, and thus no more pixels are popped from the RGB Interface module 302 into Dither module 502, while a next pixel is being popped from Dither module 502 into Display Port module 304. This allows an uninterrupted flow when Display Port module 304 starts requesting pixels, without requiring a large FIFO to store all the dithered pixels.

Figure 8:
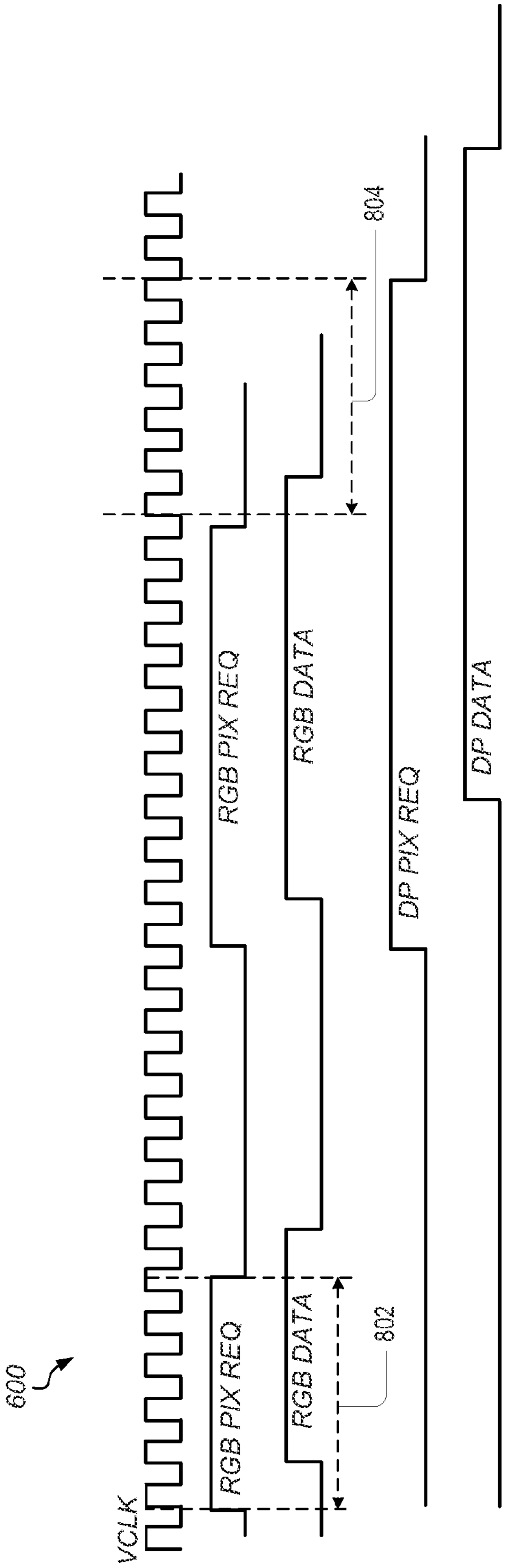
FIG. 8 is a timing diagram illustrating the timing of the signals featured in the display controller of FIG. 7.

FIG. 8 shows a timing diagram 600 illustrating the timing of some of the operating signals of the display controller shown in FIG. 7. As indicated, time period 802 corresponds to the time period during which Prefetch module 506 issues enough pixel requests—conveyed through Mask 504 to RGB Interface module 302 as ‘RGB PIX REQ’—to fill the Dither Pipeline in Dither module 502. As seen in timing diagram 600, once the Dither pipeline has been filled, Prefetch module 506 ceases to issue pixel requests, which results in ‘RGB PIX REQ’ being deasserted at the end of time period 802. Subsequently, no pixel data is provided to either Dither module 502 or Display Port module 304, until Display Port module 304 issues a pixel request by asserting ‘DP PIX REQ’. Asserting ‘DP PIX REQ’ results in ‘RGB PIX REQ’ being asserted, and the clock gating being lifted off Dither Module 502, which results in Data being popped from the display pipe into Dither module 502, as indicated by ‘RGB DATA’ appearing on the ‘RGB DATA’ line, and pixels also being popped from Dither module 502 into Display Port module 304, as indicated by ‘DP DATA’ appearing on the ‘DP DATA’ line.

As also shown in timing diagram 600, ‘RGB PIX REQ’ is deasserted before ‘DP PIX REQ’ is deasserted, to account for Dither Pipeline Depth. That is, during time period 804—which corresponds to the time period during which Display Port module 304 requests the final N pixels—while ‘DP PIX REQ’ remains asserted, Prefetch module 506 uses REQ MASK 504 to mask ‘DP PIX REQ’ to deassert ‘RGB PIX REQ’. This results in pixels no longer being popped into Dither module 502, while the clock gating of Dither module 502 is still lifted, and the final pixels are provided to Display Port module 304 from Dither module 502, as indicated by the data appearing on the ‘DP DATA’ line until the end of time period 804. Subsequently, Prefetch module 506 may again issue pixel requests at a later time to prefetch pixels to Dither module 502 in the manner described above.

Figure 9:
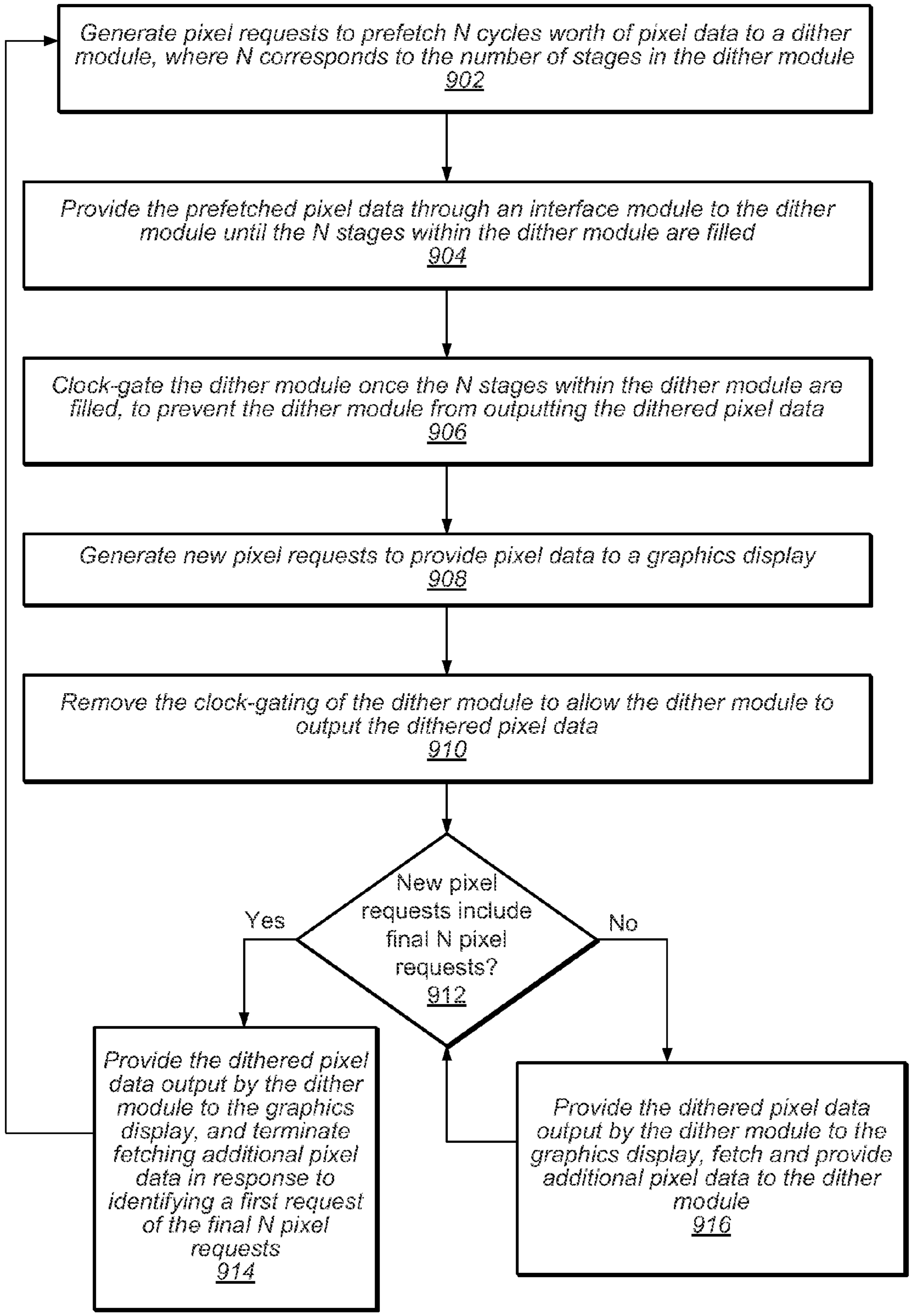
FIG. 9 is a flow diagram illustrating of one embodiment of a method for controlling data flow while performing dithering in a display controller.

FIG. 9 shows a flow diagram illustrating one embodiment of a method for controlling data flow while performing dithering in a display controller. As indicated in block 902, pixel requests may be generated, for example by a control module in the display controller (e.g. Prefetch module 506 in FIG. 7 may be considered as being a part of such a control module) to prefetch N cycles worth of pixel data to a dither module (e.g. dither module 502 in FIG. 7), where N corresponds to a number of stages in the dither module. As indicated in block 904, the prefetched pixel data may be provided through an interface module (e.g. RGB interface module 302) to the dither module until the N stages within the dither module are filled. As indicated in block 906, the dither module may be clock-gated once the N stages within the dither module are filled, to prevent the dither module from outputting the dithered pixel data. Per block 908, new pixel requests may be generated (e.g. by a display port module in the display controller, such as module 304 in FIG. 7) with the intent to provide pixel data to a graphics display. As indicated in block 910, in response to the new pixel requests, the clock-gating of the dither module may be removed to allow the dither module to output the dithered pixel data. If the new pixel requests do not include requests for a final N pixels ('No' branch from block 912), the dithered pixel data output by the dither module may be provided to the graphics display, and additional pixel data may be fetched and provided to the dither module (block 916). If the new pixel requests include requests for a final N pixels ('Yes' branch from block 912), the dithered pixel data output by the dither module may be provided to the graphics display, and fetching additional pixel data may be stopped in response to identifying a first request of the final N pixel requests (block 914).

Figure 10:
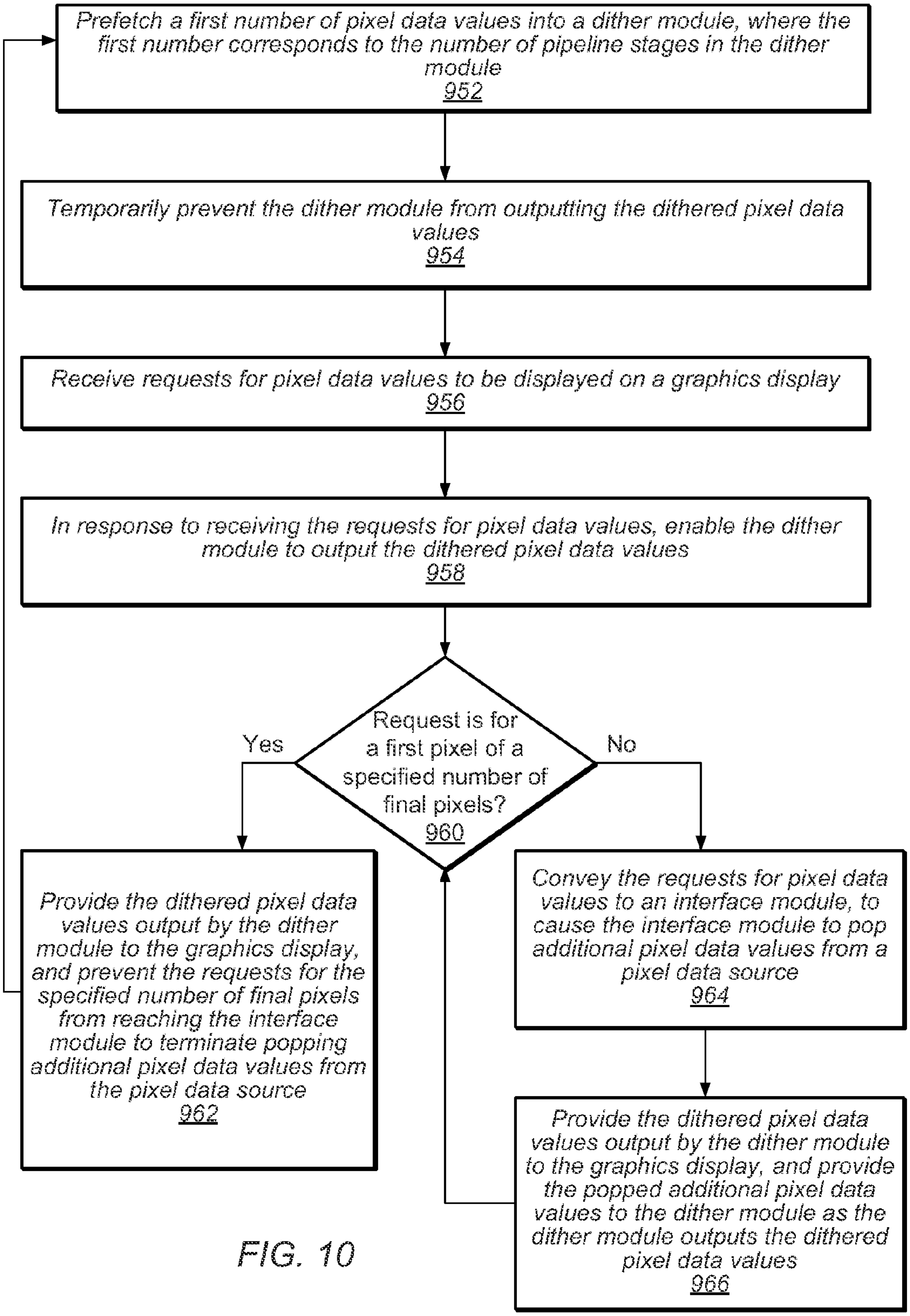
FIG. 10 is a flow diagram illustrating an alternate embodiment of a method for controlling data flow while performing dithering in a display controller.

FIG. 10 is a flow diagram illustrating an alternate embodiment of a method for controlling data flow while performing dithering in a display controller. As described in block 952, a first number of pixel data values may be prefetched into a dither module within the display controller (e.g. dither module 502 in FIG. 7), where the first number corresponds to the number of pipeline stages in the dither module. As block 904 indicates, the dither module may be temporarily prevented from outputting the dithered pixel data values. Subsequently, requests for pixel data values to be displayed on a graphics display may be received (e.g. from a display port module—such as module 304 in FIG. 7—within the display controller) as shown in block 956. In response to receiving the requests for pixel data values, the dither module may be enabled to output the dithered pixel data values (block 958). If the current request of the requests for pixel data values is not for a first pixel of a specified number of final pixels ('No' branch from block 960), the requests for pixel data values may be conveyed to an interface module, to cause the interface module to pop additional pixel data values from a pixel data source (block 964). The pixel data source may be a display pipe, such as display pipe 212 of FIG. 2, from where the first number of pixel data values may have been prefetched. The dithered pixel data values output by the dither module may be provided to the graphics display, and the popped additional pixel data values may be provided to the dither module as the dither module outputs the dithered pixel data values (block 966). If the current request of the requests for pixel data values is for a first pixel of a specified number of final pixels ('Yes' branch from block 960), the dithered pixel data values output by the dither module may be provided to the graphics display, and the requests for the specified number of final pixels may be prevented from reaching the interface module to terminate popping additional pixel data values from the pixel data source (block 962).

Numerous variations and modifications will become apparent to those skilled in the art once the above disclosure is fully appreciated. It is intended that the following claims be interpreted to embrace all such variations and modifications.

We claim:

1. An apparatus comprising:

a display controller interface module having a target-master interface, the display controller interface module configured to output a pixel stream of pixel values;

a dither module having a source-master interface, the dither module coupled to receive the pixel stream from the display controller interface module, and configured to dither the pixel values of the received pixel stream to obtain a dithered pixel stream;

a display port module having a target-master interface, the display port module coupled to receive pixels of the dithered pixel stream, and configured to transmit the received pixels of the dithered pixel stream; and a control unit configured to generate interface signals to the display controller interface module and the dither module, and clock-gate the dither module, to manage flow of the pixel stream from the display controller interface module to the dither module to the display port module.

2. The apparatus of claim 1, wherein the display port module is configured to transmit the received pixels of the dithered pixel stream to a display monitor.

3. The apparatus of claim 1, wherein the control unit is configured to issue pixel request signals to the display controller interface module to induce the display controller interface module to pop pixels from a display pipe to output as the pixel stream of pixel values.

4. The apparatus of claim 3, wherein the control unit is configured to issue the pixel request signals until a pixel processing pipeline within the dither module is full.

5. The apparatus of claim 1, wherein the pixel values comprise Red-Green-Blue (RGB) pixel values.

6. A display controller configured to deliver pixels to a graphics display, the display controller comprising:

a Red-Green-Blue (RGB) interface module configured to pop RGB pixel values from a display pipe, and output the popped RGB pixel values as a pixel stream;

a dither module coupled to receive the pixel stream from the RGB interface module, and configured to perform dithering operations on the received pixel stream to generate a dithered pixel stream;

a display port interface module coupled to receive the dithered pixel stream from the dither module, and configured to transmit the dithered pixel stream to the graphics display; and a control unit configured to prevent the dither module from outputting the dithered pixel stream until the display port interface module issues a pixel request.

7. The display controller of claim 6, wherein the RGB interface module and the display port interface module are configured with a target-master interface, and the dither module is configured with a source-master interface.

8. The display controller of claim 6, wherein the control unit is configured to generate interface signals to the dither block and to the RGB interface module to manage flow of the RGB pixel values from the display pipe to the RGB interface module to the dither module to the display port interface module.

9. The display controller of claim 6, wherein the control unit comprises:

a prefetch unit configured to generate pixel requests to the RGB interface unit to cause the RGB Interface module to pop RGB pixel values from the display pipe and provide the popped RGB pixel values to the Dither module as part of the pixel stream until a pipeline within the dither module is full.

10. The display controller of claim 6, wherein the control unit comprises a clock-gating module configured to clock-gate the dither module to prevent the dither module from outputting the dithered pixel stream until the display port interface module issues a pixel request.

11. The display controller of claim 6, wherein the control unit comprises a pixel-request mask configured to prevent pixel requests from reaching the RGB interface module and the dither module when the display port interface module is requesting a last 'N' RGB pixel values, wherein 'N' is a nonzero integer value corresponding to a number of stages of a pipeline within the dither module.

12. A video system comprising:

a display pipe configured to process image and video pixels to generate an output pixel stream;

a graphics display configured to display images and video based on the output pixel stream; and a display controller coupled to receive the output pixel stream, the display controller comprising:

a dither module configured to dither the output pixel stream to produce a dithered pixel stream;

a display port module coupled to receive the dithered pixel stream, and provide the dithered pixel stream to the graphics display to display as corresponding images and video; and a control module configured to clock-gate the dither module to prevent the display port module from receiving the dithered pixel stream until the display port module issues a pixel request.

13. The video system of claim 12, wherein the display controller further comprises an interface module coupled to pop pixels of the output pixel stream from the display pipe to receive the output pixel stream, and provide the popped pixels of the output pixel stream to the dither module.

14. The video system of claim 13, wherein the control module is further configured to issue pixel request signals to cause the interface module to pop from the display pipe a first 'N' pixels of the output pixel stream to be provided the dither module, wherein 'N' is a nonzero integer value corresponding to a number of stages of the dither module.

15. The video system of claim 13, wherein the control module is further configured to prevent the interface module to pop pixels from the display pipe when the display port module is requesting a final 'N' pixels of the output pixel stream, wherein 'N' is a nonzero integer value corresponding to a number of stages of the dither module.

16. The video system of claim 12, wherein the control module is configured to allow the display port module to pop pixels of the dithered pixel stream from the dither module when the display port module is issuing pixel requests.

17. A method comprising:

generating first pixel requests to prefetch 'N' cycles worth of pixel data to a dither module configured to dither received pixel data to output dithered pixel data, wherein 'N' is a nonzero integer that corresponds to a number of stages in the dither module;

in response to the first pixel requests, providing the prefetched pixel data through an interface module to the dither module until the 'N' stages within the dither module are filled;

clock-gating the dither module once the 'N' stages within the dither module are filled, to prevent the dither module from outputting the dithered pixel data;

generating second pixel requests to provide pixel data to a graphics display; and in response to the second pixel requests, removing the clock-gating of the dither module to allow the dither module to output the dithered pixel data; and providing the dithered pixel data output by the dither module to the graphics display.

18. The method of claim 17, further comprising:

in response to the second pixel requests, fetching additional pixel data and providing the additional pixel data to the dither module.

19. The method of claim 18, wherein generating the second pixel requests comprises generating a final 'N' pixel requests, the method further comprising:

terminating the fetching of additional pixel data in response to identifying a first one of the final 'N' pixel requests.

20. A method comprising:

prefetching a first number of pixel data values into a dither module configured to dither received pixel data values to output dithered pixel data values, wherein the first number corresponds to a number of pipeline stages in the dither module;

temporarily preventing the dither module from outputting the dithered pixel data values;

receiving requests for pixel data values to be displayed on a graphics display; and in response to receiving the requests for pixel data values, enabling the dither module to output the dithered pixel data values; and providing the dithered pixel data values output by the dither module to the graphics display.

21. The method of claim 20, further comprising:

in response to receiving the requests for pixel data values, fetching additional pixel data values into the dither module as the dither module outputs the dithered pixel data values.

22. The method of claim 21, wherein fetching the additional pixel data values comprises:

conveying the requests for pixel data values to an interface module; and the interface module popping pixel data values from a pixel data source in response to receiving the requests for pixel data values.

23. The method of claim 21, wherein receiving the requests for pixel data values comprises receiving requests for final pixel data values to be displayed on the graphics display; and terminating fetching the additional pixel data values in response to receiving a first request of the requests for final pixel data values.

24. The method of claim 23, wherein fetching the additional pixel data values comprises:

conveying the requests for pixel data values to an interface module; and the interface module popping pixel data values from a pixel data source in response to receiving the requests for pixel data values; and wherein terminating fetching the additional pixel data values comprises preventing the requests for the final pixel data values from reaching the interface module.

25. The method of claim 20, wherein temporarily preventing the dither module from outputting the dithered pixel data values comprises clock-gating the dither module.

* * * * *